April 17, 1962 E. H. HUGENHOLTZ 3,030,588

GATED PHASE LOCK FREQUENCY CONTROL SYSTEM

Filed March 7, 1958

INVENTOR

EDUARD HERMAN HUGENHOLTZ

BY

Frank R. Trifari

AGENT

United States Patent Office 3,030,588

Patented Apr. 17, 1962

3,030,588
GATED PHASE LOCK FREQUENCY CONTROL SYSTEM

Eduard Herman Hugenholtz, Toronto, Ontario, Canada, assignor to North American Philips Company, Inc., New York, N.Y., a corporation of Delaware Filed Mar. 7, 1958, Ser. No. 719,782
Claims priority, application Canada Mar. 22, 1957
25 Claims. (Cl. 331—26)

Figures 1, 2:
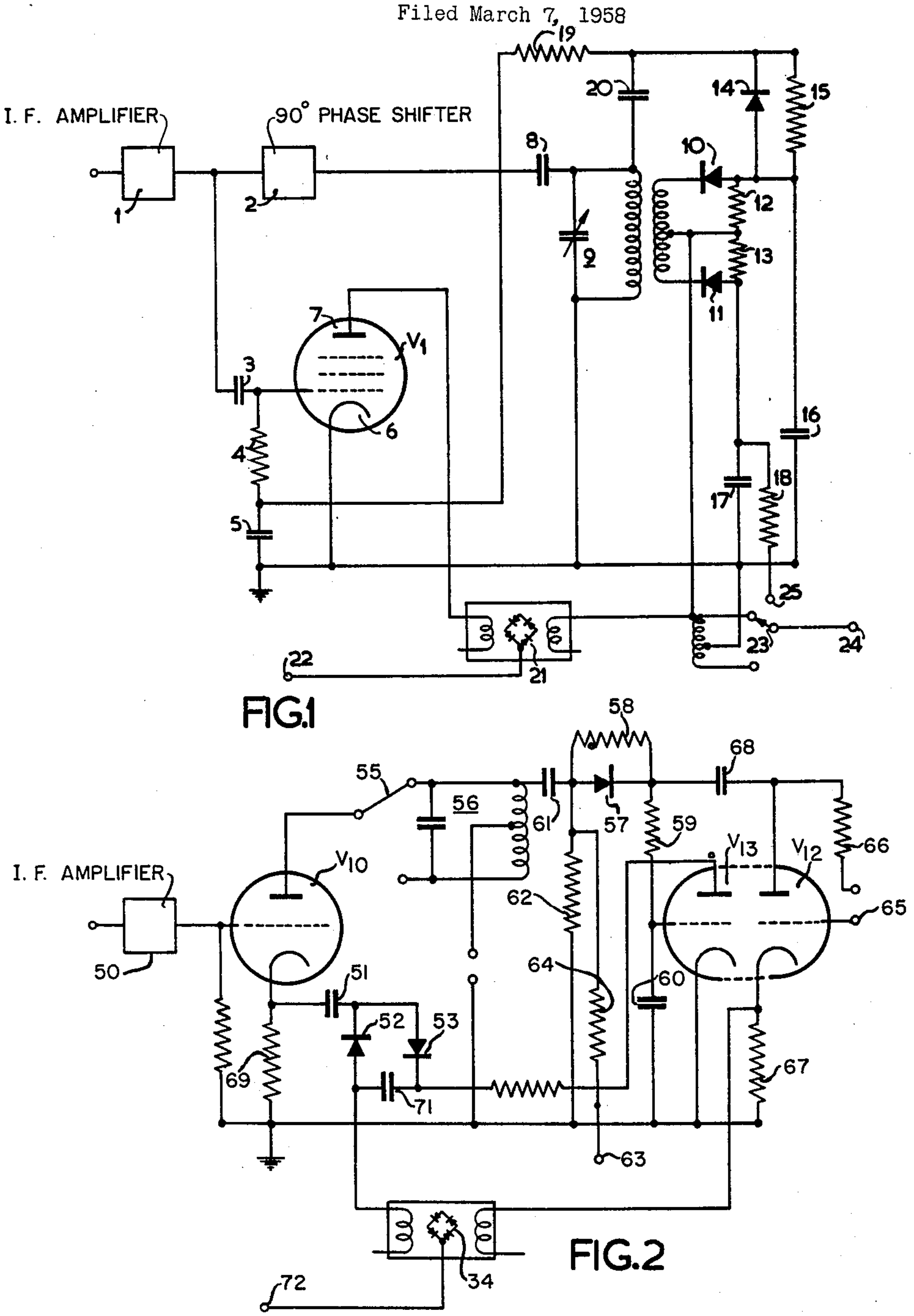

My invention relates to a tunable oscillator locking system wherein the oscillator is locked to a reference signal by means of an automatic frequency control (AFC) system employing, for instance, a reactance tube or other equivalent means.

In known systems the control voltage for the AFC is usually obtained by comparing the oscillator signal with the reference signal as in a phase discriminator. When the two signals applied to the phase discriminator means in synchronism, a direct current voltage is produced and phase lock is then possible, through the medium of the reactance tube or other equivalent control means. If the signals are not in synchronism, an alternating voltage will be produced by the phase discriminator and locking does not take place.

It has been found desirable to provide in a communication system a facility for enabling the use of a plurality of adjacent frequency channels of equal width. This may be accomplished by synchronizing the oscillator of a transmitter to a harmonic of a stabilized low frequency (i.e. 100 kc.s.) signal and thus provide, in this case, for a number of channels whose center frequencies are displaced 100 kc.s.

In such a system the harmonic spectrum of the stabilized oscillator is mixed with the output of the controlled oscillator to provide an intermediate frequency (I.F.). A predetermined intermediate frequency may be produced by the frequency of the controlled oscillator being displaced by the intermediate frequency above or below that of the stabilized oscillator. These intermediate frequencies can be considered to be images of each other and will be selected to the same degree by a tuned circuit.

In known control systems a phase discriminator is combined with a frequency discriminator in each of which are compared the I.F. signal and a component of the stabilized frequency spectrum to produce control voltages. The frequency discriminator makes possible the selection of the proper image. The tuning of the frequency discriminator determines the component of the frequency spectrum on which locking may take place and is utilized to bring the I.F. frequency toward the proper value. The phase discriminator will then lock the controlled oscillator on the desired frequency.

Disadvantages of the above type of system is that the frequency discriminator has to be tuned quite close to the desired locking frequency in order to prevent locking on the center of the frequency discriminator curve. Locking may also take place on a harmonic of the I.F., if sufficient signal gets through to the discriminator. To prevent this latter effect, greater selectivity in tuned circuits would have to be employed with the consequence that misalignment and phase shift could possibly override the advantages to be gained thereby.

The present invention overcomes the disadvantages of the prior systems by use of a tunable gate circuit which prevents the I.F. signal from reaching the phase discriminator for all frequencies except those close to the desired value. Furthermore, no phase lock is possible except with I.F. signals above a predetermined strength. A frequency discriminator is not used and, hence, a hunting voltage must necessarily be super-imposed on the control loop as the combination of a tunable gate circuit and a phase discriminator is not capable of pushing the controlled oscillator frequency towards the desired value.

In carrying out the control system in accordance with the present invention, the I.F. signal is fed through a gating circuit to a phase discriminator circuit in which it is compared with a component of the reference signal spectrum to produce a control voltage. The gating circuit is maintained in its closed state and only opens when the incoming I.F. signal is of a predetermined amplitude and in a definite phase relation with the reference signal.

Further features and advantages of my invention will become apparent as the description of my invention now proceeds with reference to the figures of the drawing of which FIG. 1 shows a preferred embodiment of my invention, and FIG. 2 shows a further embodiment thereof utilizing a modified gating system.

Referring now to FIG. 1, wherein supply voltages have been omitted for simplification, the I.F. signal is fed into an amplifier shown as block 1. The output of amplifier 1 is fed through condenser 3 to the control grid of a gating tube $V_1$. $V_1$ is normally maintained cut off by means of a negative bias applied to the grid thereof through the medium of resistors 4, 19, 15, 12, 13 and 18, and terminal 25 to which is applied a negative voltage. When proper conditions exist for phase lock, the bias is removed and gating tube $V_1$ acts as an amplifier and the amplified I.F. signal output from $V_1$ is fed to a first phase discriminator 21 in which it is compared with a reference signal, supplied by means of input terminal 24 and reversal switch 23, to produce the phase lock voltage. The manner in which the bias voltage is removed from $V_1$ will now be described.

The amplified I.F. signal from 1 is also fed through a 90° phase shift circuit 2 to tank circuit 9 of a second phase discriminator. The I.F. signal voltage developed across circuit 9 is applied to a diode 14 by means of a capacitor 20 to provide a positive voltage tending to neutralize the negative bias on $V_1$ supplied at terminal 25. Capacitors 16 and 5 smooth out the rectified voltages produced.

To the center tap of the secondary winding of this second phase discriminator is fed the reference signal applied at terminal 24. When the reference and the I.F. signals fed to the second discriminator are in phase, a further positive voltage is produced by diodes 10 and 11 and adds to the positive voltage across diode 14 produced by the rectified I.F. signal. When this condition exists and the I.F. signal is of sufficient amplitude, the bias will be removed from gating tube $V_1$ to allow amplified I.F. signal to be supplied to phase discriminator 21 and phase lock to take place. When the I.F. and reference signals applied to the second discriminator are in phase opposition, the rectified voltages produced thereby substantially neutralize each other and the gate circuit of $V_1$ remains closed.

By means of phase reversal switch 23, it is possible to provide for phase lock on the selected I.F. signal or its image according to the polarity versus change of the voltage produced by discriminator 21.

It should be noted that the phase shift circuit 2 is outside the actual control circuit and hence does not lead to instability.

Referring now to FIG. 2 wherein power supplies have been omitted for simplicity reasons, the I.F. signal is amplified by amplifier 50 and applied to a further amplifier tube $V_{10}$. The I.F. signal voltage developed at the cathode of $V_{10}$ is fed by means of capacitor 51 and rectifier 52 to a phase discriminator 54 providing proper conditions exit with regard to rectifier 53 and a gate control tube $V_{13}$.

The amplified I.F. voltage at the anode of $V_{10}$ is fed through a phase reversing switching system 55 to a tank circuit 56 tuned to the frequency of the I.F. voltage. The I.F. voltage developed across tank circuit 56 is applied to a rectifier circuit comprising diode 57, resistor 58 and a filter circuit consisting of resistor 59 and capacitor 60. Capacitor 61 in conjunction with resistor 62 produces a phase shift of 90° in the I.F. voltage between tank circuit 56 and diode 57.

A negative delay voltage is applied, through the medium of input terminal 63, resistors 64, 58 and 59, to the control grid of $V_{13}$ to cause it to be normally non-conducting.

A component of a stabilized reference signal is applied through input terminal 65 to the control grid of a triode amplifier $V_{12}$. Triode $V_{12}$ has anode and cathode loads constituted by upbypassed resistors 66 and 67 and consequently acts as a phase splitter. The reference signal voltage developed across cathode resistor 67 is applied to discriminator 54. The reference signal developed across resistor 66 is applied by means of capacitor 68 to diode 12.

The manner in which the gating is controlled will now be explained. As was stated previously, the I.F. signal voltage developed across cathode resistor 69 of tube $V_1$ is applied to diodes 52 and 53 which are poled to conduct in opposite directions.

Considering the condition wherein triode $V_{13}$ is non-conducting due to the negative bias supplied via terminal 63, i.e. the I.F. signal amplitude and phase is incorrect for locking, diodes 52 and 53 are therefore blocked because of their series relationship to the direct current path of $V_{13}$. The I.F. signal on capacitor 51 is blocked due to the rectifier action of diode 52 which conducts to render the junction between capacitor 51 and diode 52 negative with respect to the junction between diode 52 and capacitor 71. Under these conditions the intermediate frequency signal developed across resistor 69 is blocked from discriminator 54.

Consider now the condition wherein the I.F. signal supplied to tank circuit 56 is of the required amplitude and phase as compared to the reference signal developed across resistor 66, a voltage is built up across diode 57 which substantially neutralizes the negative bias supplied to $V_{13}$. Diodes 52 and 53 are unblocked and the I.F. signal is applied to discriminator 54 where in it is compared with the reference signal developed across resistor 67 to provide a control voltage at terminal 72 capable of maintaining the required phase lock.

Reversal of switch 55 facilitates the locking of the controlled oscillator with respect to either image of the I.F. signal produced by mixing the output of the oscillator with a reference frequency spectrum.

It will be apparent from the foregoing that I have provided a phase lock control system which offers advantages over those of the prior art. It should be noted that various modifications may be made, such as substitution of tube or rectifier types, elimination or increase of amplification etc., without departing from the spirit and the scope of my invention.

The embodiments of the invention in which an exclusive property or privilege is claimed are defined as follows:

1. In a frequency control system wherein the frequency of a tunable oscillator is adapted to be locked with that of a reference signal, a phase discriminator, means feeding a signal representative of said reference signal to said phase discriminator and gate means adapted to open and feed a signal representative of said oscillator frequency to said phase discriminator when said oscillator frequency approaches substantially a desired value, wherein said gate means is controlled by a voltage produced by application of said representative signals to a common rectifier means.

2. The system as claimed in claim 1 wherein a hunting voltage is superimposed on the output voltage of said phase discriminator.

3. The system as set forth in claim 1 wherein the signal representative of said reference signal supplied to said phase discriminator may be reversed in phase to provide for locking on the image of the signal representative of said oscillator frequency.

4. Apparatus for producing a control voltage representative of the phase difference between a signal frequency voltage and the frequency of a reference signal voltage comprising a phase discriminator, means supplying a signal representative of said reference signal to said phase discriminator, normally closed gate means adapted to supply said signal frequency voltage to said phase discriminator to produce a control voltage which varies with the phase difference of said signal frequency voltage and said representative signal and means responsive to said last two mentioned signals to produce a voltage effective to open said gate when predetermined phase and amplitude relations exist between said last two mentioned signals.

5. The system as set forth in claim 4 wherein said gate means comprises a vacuum tube amplifier normally biased to cut off.

6. The system as set forth in claim 4 wherein said gate means comprises biased rectifiers.

7. A system as set forth in claim 4 wherein a hunting voltage is superimposed on said control voltage.

8. Apparatus for producing a control voltage representative of the difference frequency between the frequency of a tunable oscillator and a component of the harmonic frequency spectrum of a stabilized oscillator comprising means to select said difference frequency and apply it to the input of an amplifier which is normally biased to cutoff, means supplying said difference frequency to a circuit tuned thereto, means rectifying the voltage produced across said tuned circuit, rectifier means producing a voltage representative of the phase and amplitude relations of the difference frequency and said component, means adding the voltages produced by rectification and utilizing the product, obtained thereby, to neutralize the bias on said amplifier when proper phase and amplitude relations exist between said difference and component frequencies, to supply amplified difference frequency to a phase discriminator wherein it is compared with said component frequency to produce said control voltage.

9. Apparatus for maintaining a predetermined difference frequency between the oscillation frequency of a tunable oscillator and a reference oscillation comprising a normally closed gate means adapted to supply one of said oscillation frequencies to a phase discriminator, means normally supplying the other of said oscillation frequencies to said phase discriminator, means selectively supplying said first mentioned oscillation and a signal representative of said reference oscillation to a rectifier circuit to produce a control voltage effective to open said gate when predetermined amplitude and phase relations exist between said first oscillation and said representative signal, and means utilizing the output voltage of said phase discriminator to control the frequency of said tunable oscillator.

10. Apparatus for maintaining a predetermined difference frequency between the frequency of a tunable oscillator and that of a component of the harmonic frequency spectrum of a stabilized oscillator comprising means to select said predetermined difference frequency and apply it to a normally inoperative amplifier, means supplying said difference frequency to a tuned circuit selective thereto, first rectifier means producing a first direct current voltage representative of the amplitude of said difference frequency produced across said tuned circuit, second rectifier means comparing the amplitude and phase of said difference frequency produced across said tuned circuit with the amplitude and phase of said component to produce a second direct current voltage, means adding said first and second direct current voltages to produce a third direct current voltage and means utilizing said third direct current voltage to control the operation of said amplifier to supply amplified difference frequency to a phase discriminator wherein it is compared with said component frequency to produce a direct current voltage which is utilized to maintain said predetermined difference.

11. Apparatus as claimed in claim 10 wherein said amplifier is normally biased beyond cutoff.

12. Apparatus as claimed in claim 10 wherein means is provided for reversal of the phase of one of said frequencies to provide for frequency control on the image of said difference frequency.

13. Apparatus for controlling the frequency of a tunable oscillator with respect to a reference frequency comprising means to selectively amplify a signal representative of said tunable oscillator frequency, means comparing the amplified signal with respect to phase and amplitude with that of said reference frequency to produce a first direct current control voltage, gate means adapted to supply said representative signal to a phase discriminator wherein it is compared with said reference frequency to produce a frequency control voltage, and switch means under control of said first control voltage and adapted to open said gate when predetermined amplitude and phase relations exist between said reference and representative signals, said frequency control voltage being utilized to maintain the frequency of said tunable oscillator with respect to said reference frequency.

14. In a frequency control system including a tunable oscillator the frequency of which is to be controlled, a source of reference oscillations, means mixing the output voltage of said tunable oscillator with said reference oscillations to produce a difference frequency voltage, means selecting said difference frequency voltage and supplying it to a rectifier having a load circuit, a normally closed gating circuit consisting of a normally blocked direct current switch having a pair of diodes in series current carrying sense therewith, a first capacitor connected between the extremities of said series connected diodes, a second capacitor coupling said difference frequency voltage to the common junction of said diodes, a circuit connection between the end of said series circuit remote from said switch and a phase discriminator, means supplying a signal representative of the reference oscillation to said phase discriminator to produce a frequency controlling voltage on the presence of said difference frequency in said phase discriminator and means supplying said representative signal to said rectifier means to produce in said load circuit in conjunction with said difference frequency voltage a direct current voltage effective to open said switch when predetermined phase and amplitude relations exist between said reference and difference frequency voltages.

15. In a frequency control system including a tunable oscillator the frequency of which is to be controlled, a source of reference oscillations, means mixing the output of said tunable oscillator with said reference oscillations to produce a difference frequency voltage, means supplying said difference frequency voltage to a rectifier having a load circuit, means supplying a signal representative of said reference oscillations to said rectifier to produce in conjunction with said difference frequency a gate control voltage which varies with the phase and amplitude relationship between said reference and difference frequency signals, a phase discriminator adapted to produce a frequency control voltage for said tunable oscillator, means supplying said difference and representative frequency voltages to said frequency discriminator, and gate means actuated by said gate control voltage effective to prevent the application of one of said voltages to said phase discriminator in the absence of a predetermined gate control voltage value.

16. The system as set forth in claim 2 wherein the signal representative of said reference signal supplied to said phase discriminator may be reversed in phase to provide for locking on the image of the signal representative of said oscillator frequency.

17. A system as set forth in claim 5 wherein a hunting voltage is superimposed on said control voltage.

18. A system as set forth in claim 6 wherein a hunting voltage is superimposed on said control voltage.

19. Apparatus as claimed in claim 11 wherein means is provided for reversal of the phase of one of said frequencies to provide for frequency control on the image of said difference frequency.

20. Apparatus for controlling the frequency of signals from a controllably variable signal source by signals from a reference signal source comprising first signal comparing means for comparing signals from said reference signal source with signals representative of signals from said controllably variable signal source, gating means responsive to said representative signals and said first signal comparing means to pass said representative signals when a predetermined relationship exists between said representative signals and signals from said reference signal source, and second signal comparing means for comparing the signals from said gating means with the signals from said reference signal source for transmitting control signals to said controllably variable signal source.

21. Apparatus for controlling the frequency of signals from a controllably variable signal source by signals from a reference signal source comprising gating means adapted to receive signals from said controllably variable signal source, signal comparing means for comparing signals from said reference signal source with signals from said controllably variable signal source, said gating means being responsive to said signal comparing means to pass the controllably variable signals when a predetermined relationship exists between the signals from said controllably variable signal source and said reference signal source, and a phase discriminator responsive to the signals from said gating means and said reference signal source, said phase discriminator transmitting signals to control said controllably variable signal source.

22. Apparatus for controlling the frequency of signals from a controllably variable signal source by signals from a reference signal source comprising first signal comparing means for comparing signals from said reference signal source with signals from said controllably variable signal source, gating means responsive to said first signal comparing means and to said controllably variable signals to pass the controllably variable signals when a predetermined phase and amplitude relationship exists between the signals from said controllably variable signal source and said reference signal source, and second signal comparing means for comparing the signals from said gating means with the signals from said reference signal source for transmitting a control signal to said controllably variable signal source.

23. Apparatus for controlling the frequency of signals from a controllably variable signal source by signals from a reference signal source comprising gating means adapted to receive signals from said controllably variable signal source, signal comparing means for comparing signals from said reference signal source with signals from said controllably variable signal source, said gating means being responsive to said signal comparing means to pass the controllably variable signals when a predetermined phase and amplitude relationship exists between the signals from said controllably variable signal source and said reference signal source, and a phase discriminator responsive to the signals from said gating means and said reference signal source for transmitting signals to control said controllably variable signal source.

24. Apparatus for producing a control voltage representative of the phase difference between a signal frequency voltage and a reference frequency voltage comprising gating means responsive to pass said signal frequency voltage when opened, signal comparing means responsive to said reference frequency voltage and to said signal frequency voltage via said gating means when opened for producing said control voltage representative of the phase difference between said signal frequency voltage and said reference frequency voltage, and control means for opening said gating means when a predetermined condition is present, said control means being responsive to the relative phase of said signal frequency voltage and said reference frequency voltage.

25. Apparatus for producing a control voltage representative of the phase difference between a signal frequency voltage and a reference frequency voltage comprising gating means responsive to pass said signal frequency voltage when opened, signal comparing means responsive to said reference frequency voltage and to said signal frequency voltage via said gating means when opened for producing said control voltage representative of the phase difference between said signal frequency voltage and said reference frequency voltage, and control means for opening said gating means when a predetermined condition is present, said control means being responsive to the strength of said signal frequency voltage for producing a first control signal and to the relative phase of said signal frequency voltage and said reference frequency voltage for producing a second control signal, said control means opening said gating means when the sum of said first and second control signals is a predetermined value.

References Cited in the file of this patent

UNITED STATES PATENTS

| | | |
|---|---|---|
| 2,468,350 | Sunstein | Apr. 26, 1949 |
| 2,521,058 | Goldberg | Sept. 5, 1950 |
| 2,521,789 | Grosdoff | Sept. 12, 1950 |
| 2,666,136 | Carpenter | Jan. 12, 1954 |

FOREIGN PATENTS

| | | |
|---|---|---|
| 148,588 | Australia | Oct. 10, 1952 |